(12) United States Patent
Sala et al.

(10) Patent No.: US 7,899,020 B2
(45) Date of Patent: *Mar. 1, 2011

(54) METHOD FOR A GENERALIZED PACKET HEADER SUPPRESSION MECHANISM USING A WIRELESS COMMUNICATIONS MEDIUM

(75) Inventors: Dolors Sala, Atlanta, GA (US); Ajay Chandra V. Gummalla, Atlanta, GA (US)

(73) Assignee: Broadcom Corporation, Irvine, CA (US)

( * ) Notice: Subject to any disclaimer, the term of this patent is extended or adjusted under 35 U.S.C. 154(b) by 842 days.

This patent is subject to a terminal disclaimer.

(21) Appl. No.: 11/808,697

(22) Filed: Jun. 12, 2007

(65) Prior Publication Data

US 2008/0002715 A1     Jan. 3, 2008

Related U.S. Application Data

(63) Continuation of application No. 10/046,724, filed on Jan. 17, 2002, now Pat. No. 7,400,613.

(60) Provisional application No. 60/262,204, filed on Jan. 17, 2001.

(51) Int. Cl.
H04W 4/00 (2009.01)

(52) U.S. Cl. .......................... 370/341; 370/389; 370/431

(58) Field of Classification Search ................. 370/341, 370/431, 389, 392, 401, 474, 352; 725/111; 375/222

See application file for complete search history.

(56) References Cited

U.S. PATENT DOCUMENTS

| | | | |
|---|---|---|---|
| 5,293,379 A | 3/1994 | Carr | |
| 6,438,123 B1 * | 8/2002 | Chapman | 370/351 |
| 6,636,485 B1 | 10/2003 | Fijolek et al. | |
| 6,742,187 B1 | 5/2004 | Vogel | |
| 6,865,162 B1 * | 3/2005 | Clemm | 370/286 |
| 6,940,874 B2 | 9/2005 | Ruszczyk et al. | |
| 2002/0065907 A1 * | 5/2002 | Cloonan et al. | 709/223 |
| 2002/0115421 A1 | 8/2002 | Shahar et al. | |

FOREIGN PATENT DOCUMENTS

EP       0 933 876 A1    8/1999

OTHER PUBLICATIONS

DOCSIS 1.1: Data-Over-Cable Service Interface Specifications, copyright 1999-2005, cover 1-6, pp. 167-169.
International Search Report issued Sep. 13, 2002 for Appl. No. PCT/US02/01203, 7 pages.

* cited by examiner

Primary Examiner—Jayanti K Patel
Assistant Examiner—Jung Park
(74) Attorney, Agent, or Firm—Sterne, Kessler, Goldstein and Fox P.L.L.C.

(57) ABSTRACT

A method for reducing the bandwidth required to transmit a data packet via a wireless network is provided. In an embodiment, the method includes generating a packet to be transmitted via the wireless network. Once a packet is generated, a packet a packet type of the packet to be transmitted via the wireless network is determined. Based on the packet type, a suppression rule is selectively applied to the packet to generate a suppressed packet. Applying the suppression rule includes suppressing at least a portion of the header of the packet and adding a descriptor associated with the header suppression rule to the packet. The method concludes with the transmittal of the suppressed packet via the wireless network.

15 Claims, 9 Drawing Sheets

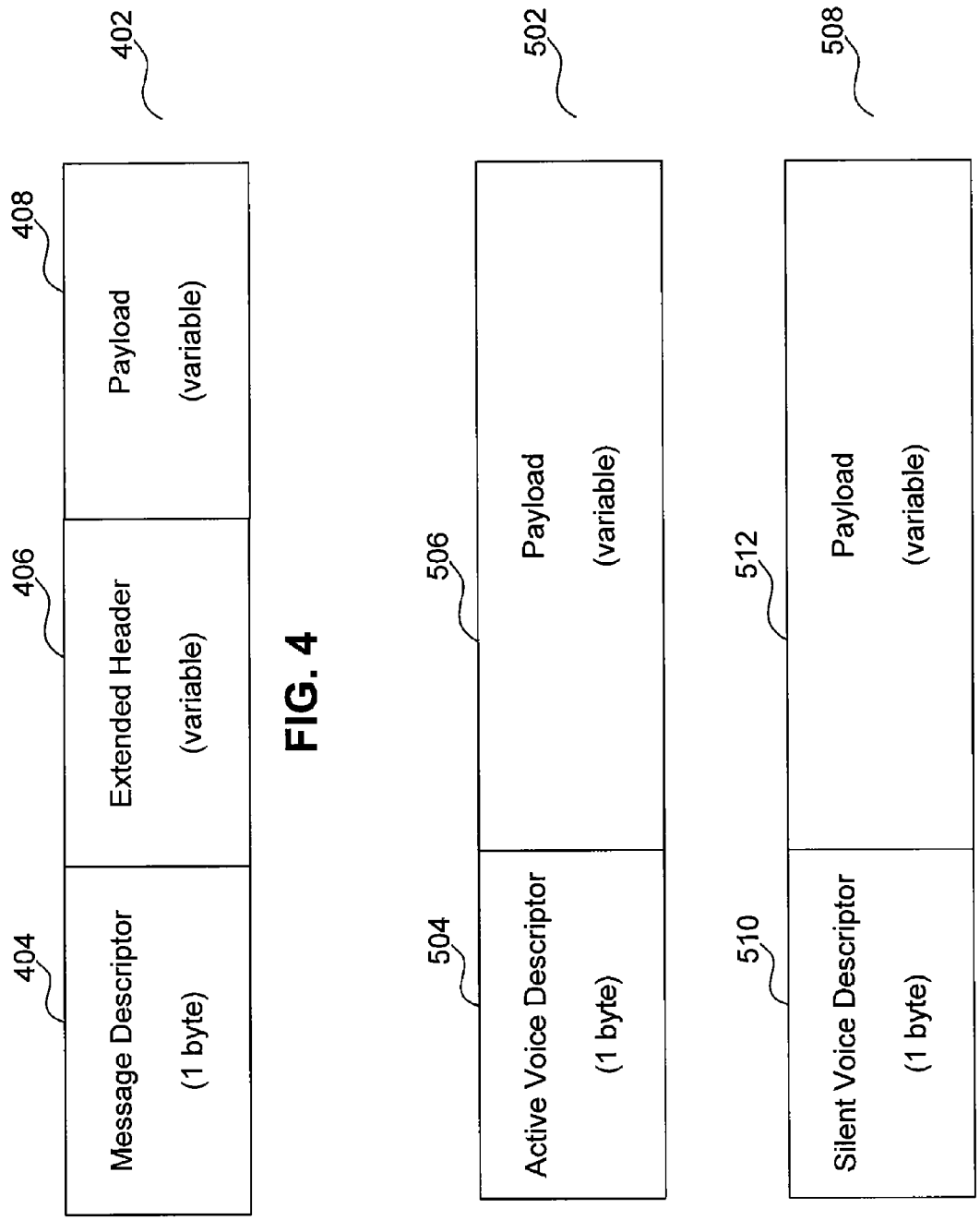

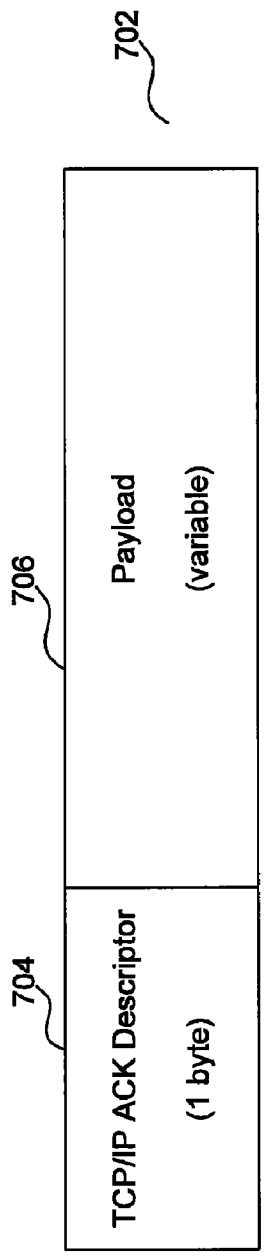
FIG. 7
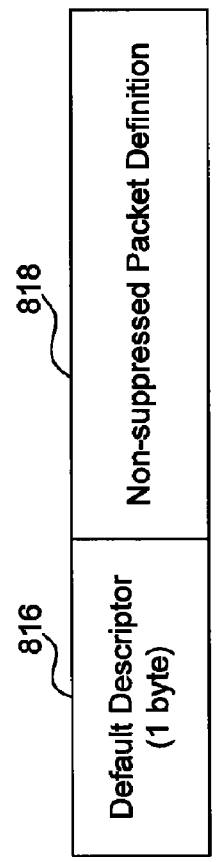
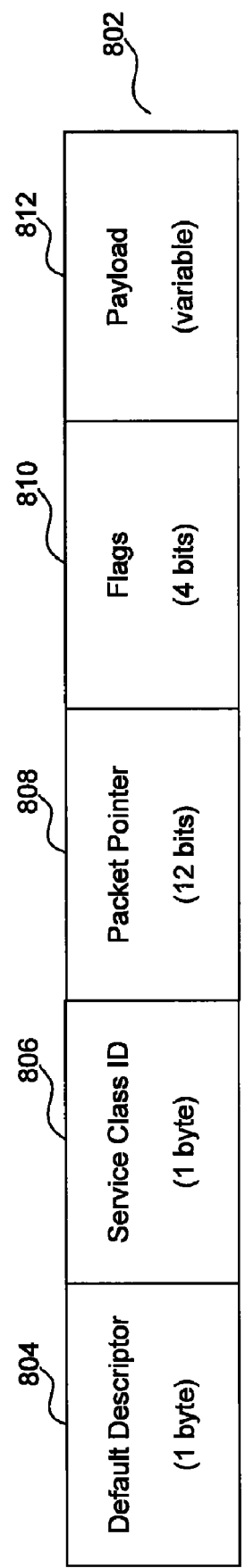
FIG. 8

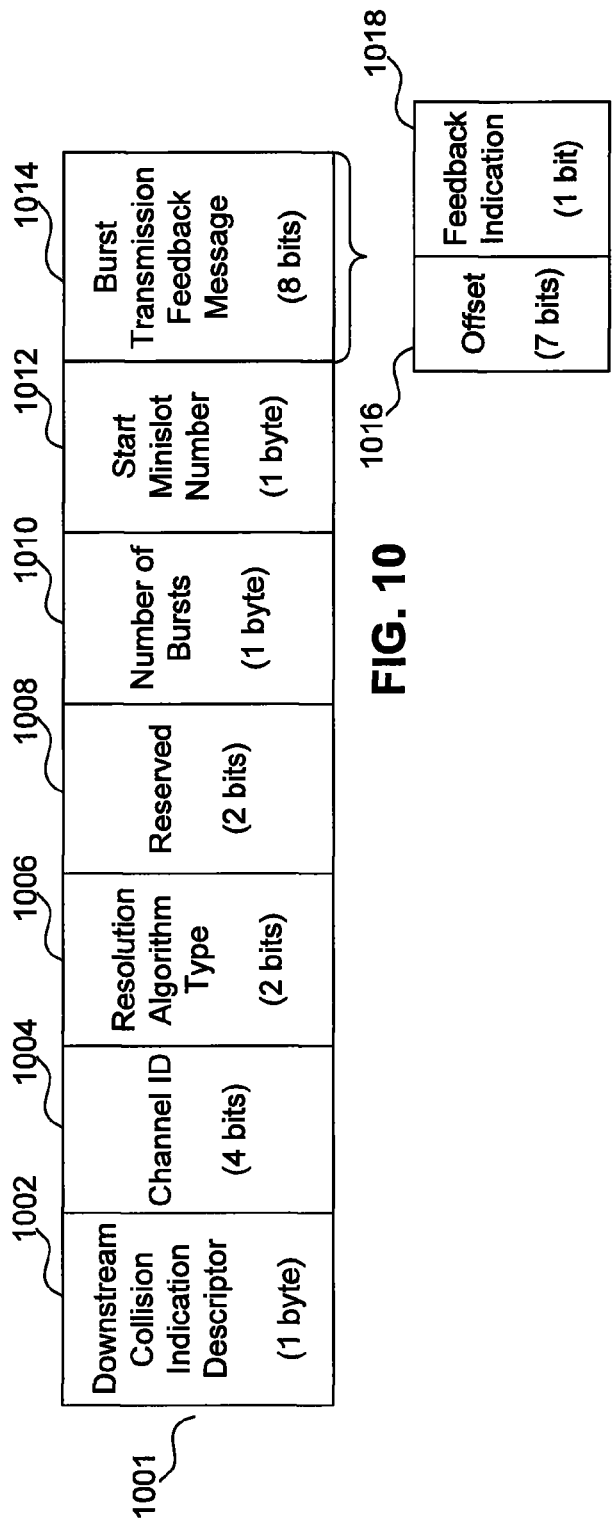
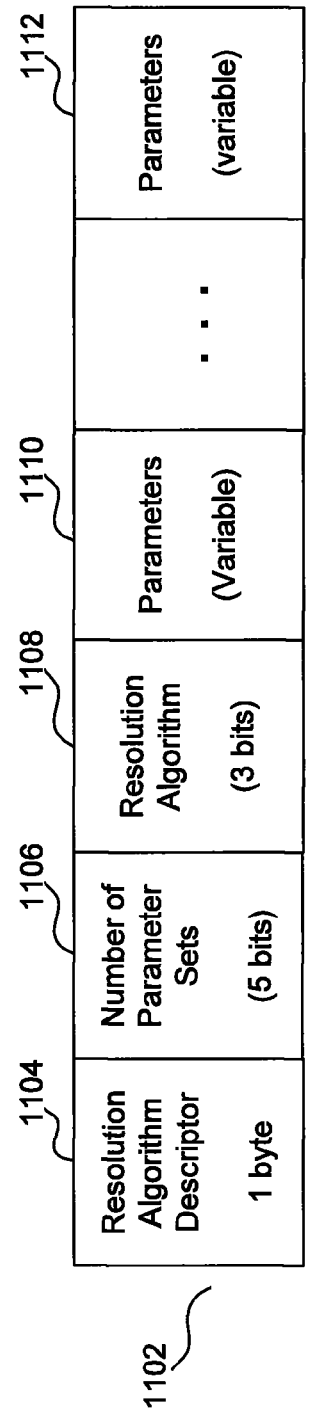
FIG. 10
FIG. 11

METHOD FOR A GENERALIZED PACKET HEADER SUPPRESSION MECHANISM USING A WIRELESS COMMUNICATIONS MEDIUM

CROSS-REFERENCE TO RELATED APPLICATIONS

The present application is a continuation of U.S. patent application Ser. No. 10/046,724, filed Jan. 17, 2002, entitled "System and Method for a Generalized Packet Header Suppression Mechanism," by Sala et al., ('724 Application), now U.S. Pat. No. 7,400,613, issued Jul. 15, 2008, which is hereby incorporated by reference in its entirety.

The '724 Application in turn claims priority to provisional application U.S. Patent Ser. No. 60/262,204, filed Jan. 17, 2001, entitled "Generalized Header Suppression Mechanism," by Sala et al., which is also incorporated by reference in its entirety herein.

BACKGROUND OF THE INVENTION

1. Field of the Invention

The present invention is generally related to increasing the efficiency of transmitting well-known packets via communication mediums.

2. Background Art

The importance to the modem economy of rapid data access and exchange cannot be overstated. This explains the exponentially increasing popularity of the data access and exchange via cable networks (including coaxial cable or Hybrid fiber coaxial cable), the Internet, intranets, wireless networks, satellites and so forth (i.e., communication mediums). Rapid data access and exchange is partly dependent upon how efficiently bandwidth is allocated to a data provider in order for the data provider to transfer the requested data to a user via one of the communication mediums mentioned above.

One very desirable solution for rapid data access and exchange is via cable networks and cable modems. Cable modems provide communications on cable networks. In general, a user connects a cable modem to the TV outlet for his or her cable TV, and the cable TV operator connects a cable modem termination system ("CMTS") in the operator's headend. The CMTS is a central device for connecting the cable network to a data network like the Internet. The CMTS is a central distribution point for a cable network. Data flows "downstream" from the CMTS to the cable modem (i.e., downstream communication). Alternatively, data flows "upstream" from the cable modem to the CMTS (i.e., upstream communication).

A common cable modem standard today is the Data Over Cable Service Interface Specification ("DOCSIS"). DOCSIS defines technical specifications for both cable modems and CMTS.

Data that flows in a cable network between the CMTS and the cable modem is generally referred to as a packet. Types of well-known packets in the cable network include, but are not limited to, requests for bandwidth from the cable modem to the CMTS, bandwidth grants from the CMTS to the cable modem, Transmission Control Protocol/Internet Protocol Acknowledgment (TCP/IP ACK) messages, voice packets, and so forth. Each of these types of packets include a header that is well-structured and known. Since the headers of well-known packets are well-structured and known, it is a waste of bandwidth to transmit these headers over communication mediums. What is needed is a mechanism for both the sender and receiver of a packet to be able to infer the header of a well-known packet from the packet type alone, thus reducing the amount of bandwidth required to transmit the packet between the two. This is particularly important in scenarios, such as cable networks, where reducing bandwidth requirements is more critical than reducing processing at either the cable modem or the CMTS.

BRIEF SUMMARY OF THE INVENTION

A method for reducing the bandwidth required to transmit a data packet via a wireless network is provided. In an embodiment, the method includes generating a packet to be transmitted via the wireless network. Once a packet is generated, a packet a packet type of the packet to be transmitted via the wireless network is determined. Based on the packet type, a suppression rule is selectively applied to the packet to generate a suppressed packet. Applying the suppression rule includes suppressing at least a portion of the header of the packet and adding a descriptor associated with the header suppression rule to the packet. The method concludes with the transmittal of the suppressed packet via the wireless network.

BRIEF DESCRIPTION OF THE DRAWINGS/FIGURES

The present invention will be described with reference to the accompanying drawings, wherein:

FIG. 4 illustrates the format of a general message packet according to an embodiment of the invention.

FIG. 5 illustrates the format of an active voice message and the format of a silent voice message according to an embodiment of the invention.

FIG. 7 illustrates the format of a TCP/IP ACK message according to an embodiment of the invention.

FIG. 8 illustrates the format of a default message according to an embodiment of the invention.

FIG. 10 illustrates the format of an immediate feedback message according to an embodiment of the invention.

FIG. 11 illustrates the format of a resolution algorithm message according to an embodiment of the invention.

DETAILED DESCRIPTION OF THE INVENTION

A. Overview of the Invention

The present invention is a system and method for a generalized packet header suppression mechanism. This mechanism is implemented via a descriptor table. An exact copy of the descriptor table is stored in both the sender and receiver of packets via a communication medium. Entries in the descriptor table provide the information necessary to both suppress and expand the headers of well-known packets. The sender of the packet uses the descriptor table to suppress the packet header prior to transmitting the packet over the communication medium. When the packet reaches the receiver, the receiver uses the descriptor table to expand or reconstruct the packet header. This procedure results in less bandwidth required to transmit well-known messages because known header data is not transmitted via the medium, thereby not wasting bandwidth.

One benefit of the suppression mechanism of the invention is that it allows the complete suppression of the header of a packet (as opposed to the traditional payload suppression) by a shorter message descriptor. Thus, this mechanism allows a common framework to support several protocols in the same communication medium.

For illustration purposes, the present invention is described in terms of being utilized with a cable network. It should be understood that the present invention is not limited to use with a cable network. In fact, the present invention may be used with any communication medium, including but not limited to, the Internet, intranets, fiber optic networks, wireless networks, optical networks and satellites.

Data in the present invention includes any type of information. This includes, but is not limited to, digital, voice, video, audio, etc.

B. System Architecture Overview

Figure 1:
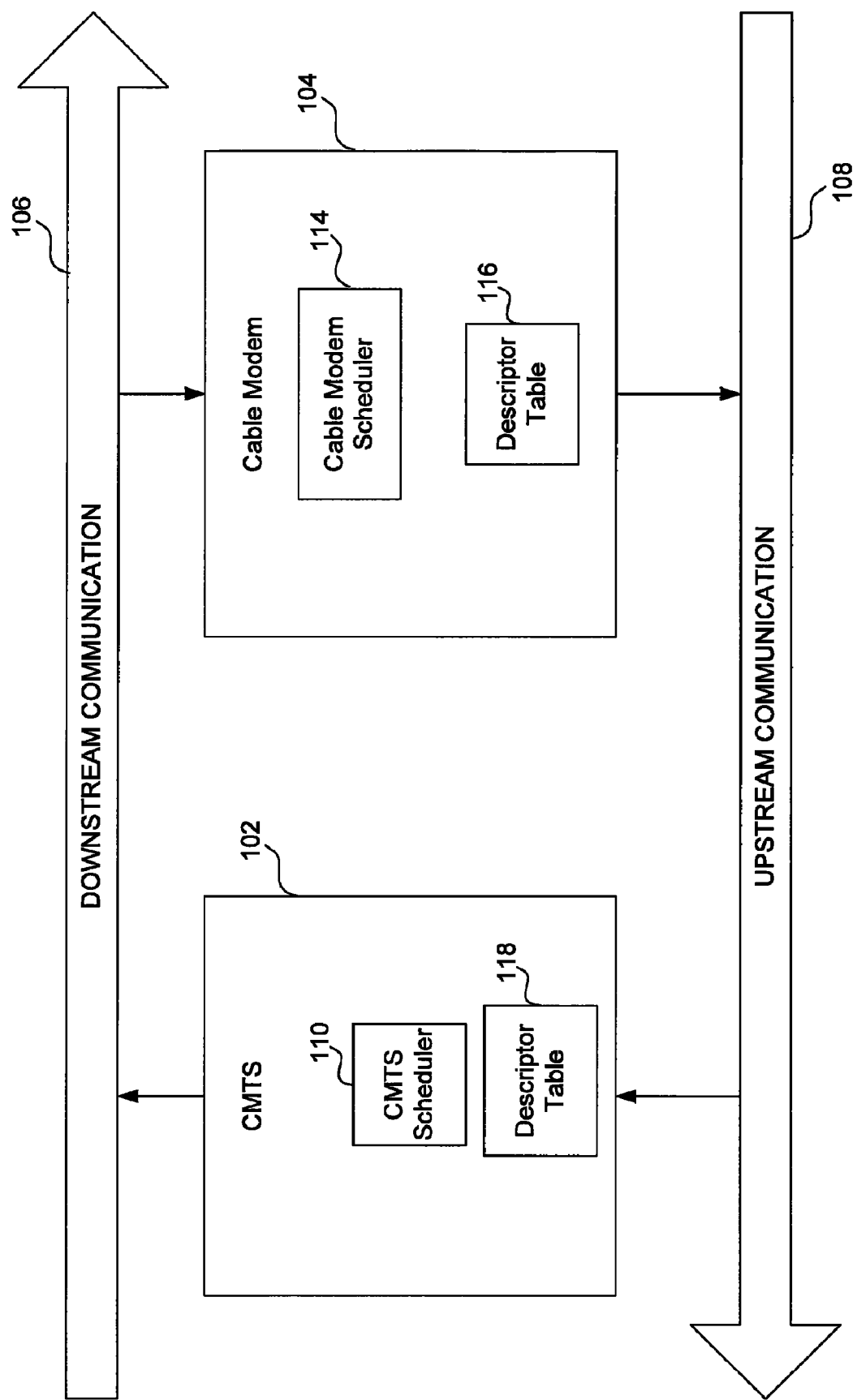
FIG. 1 is a block diagram representing an example operating environment of the present invention according to an embodiment.

FIG. 1 is a block diagram representing an example operating environment for the generalized packet header suppression mechanism of the present invention. It should be understood that the example operating environment in FIG. 1 is shown for illustrative purposes only and does not limit the invention. Referring to FIG. 1, a cable modem termination system (CMTS) 102, a cable modem 104, downstream communication 106 and upstream communication 108 are shown. CMTS 102 further includes a CMTS scheduler 110 and a packet descriptor table 118. Cable modem 104 further includes a cable modem scheduler 114 and a packet descriptor table 116. Each of these components will be briefly described next.

In general, cable modem 104 forwards or provides data via a communication medium on cable networks. Cable modem 104 receives data from a user that needs to be transferred via a cable network. For many types of data, in order for cable modem 104 to transfer the data via a cable network it must request that CMTS 102 grant to it the necessary bandwidth. Note that although FIG. 1 illustrates a single cable modem 104, the present invention is not limited to this. In fact, CMTS 102 may service requests from multiple cable modems. Here, each cable modem is assigned an unique identifier (CMID).

Cable modem scheduler 114 of cable modem 104 is responsible for multiplexing the internal traffic (i.e., requesting the necessary bandwidth that cable modem 104 needs to transfer its current types of data). As mentioned, cable modem 104 receives data from a user to be transferred via a cable network. Different types of data require different modes of transfer since the importance of timing is different with different types of data. For example, voice data cannot tolerate delays in its transfer. Alternatively, the type of data involved in file transfer can tolerate delays in its transfer.

In order to ensure the importance of timing is maintained, cable modem 104 assigns different priority identifiers to different types of data, indicated by a service class identifier (SCID). The higher the priority data has, the less of a delay that type of data will experience in its transfer via the cable network. Thus, voice data would be assigned a priority identifier with a higher priority than data involved in file transfer. Thus, cable modem scheduler 114 must take into consideration the different priorities given to the current data to be transferred and to request bandwidth from CMTS 102 accordingly.

CMTS 102 is a central device for connecting the cable network to a data network. CMTS scheduler 110 is a bandwidth manager that decides how to grant available bandwidth according to the current bandwidth requests.

Descriptor tables 116 and 118 are used by the invention to store all the information required to suppress and then reconstruct (or expand) the exact header of certain well-known types of packets in order to reduce the required bandwidth necessary to transmit the packets via a communication medium. Descriptor tables 116 and 118 are synched together and thus contain the exact same information. How the invention uses descriptor tables 116 and 118 to increase the efficiency of transmitting well-known packets via communications mediums will be described in detail below. Next some general concepts used in cable networks are described, including bandwidth requests (via the piggyback and contention mini-slot methods) and burst bandwidth grants. The two types of bandwidth requests and burst bandwidth grants are only briefly described to aid in the understanding of the present invention. Bandwidth requests via the piggyback method and the contention mini-slot method are described next, followed by burst bandwidth grants.

As mentioned above, for many types of data, in order for cable modem 104 to transfer the data via a cable network it must request that CMTS 102 grant to it the necessary bandwidth. One way for cable modem 104 to request bandwidth from CMTS 102 is to piggyback the bandwidth request in another data burst. Another way to request bandwidth from CMTS 102 is via contention mini-slots (or contention bursts). A contention mini-slot is bandwidth periodically granted by CMTS 102. Cable modem 104 can contend for a contention mini-slot with other cable modems in the system in order to send its grant for bandwidth to CMTS 102. Thus, previous reservation of the contention mini-slot by cable modem 104 is not required. Burst grants are described next.

A burst grant is a way of combining any type of data (including requests for bandwidth by cable modem 104). Here, a portion of bandwidth is assigned to cable modem 104. One way of combining requests for bandwidth is described next, although the present invention is not limited to this. Here, CMTS 102 receives bandwidth requests from one or more cable modems 104, each bandwidth request having a cable modem identifier (CMID), a service class identifier (SCID), and the amount of required bandwidth. Next, each of the bandwidth requests are stored in a data structure so as to maintain the order in which the bandwidth requests were received. Next, based on the service class identifier and the order of each bandwidth request, CMTS scheduler 110 schedules each of the bandwidth requests in an order to be serviced. CMTS scheduler 110 then combines each of the bandwidth requests having the same cable modem identifier into a data burst bandwidth. Finally, CMTS 102 grants the data burst bandwidth to the particular cable modem 104 via downstream communication 106. Descriptor tables 116 and 118 of the invention are described next in detail.

C. Descriptor Table

Descriptor tables 116 and 118 are the same table where copies of which are stored at the sender and receiver of packets in the cable network. Therefore, for simplicity descriptor tables 116 and 118 will be referred herein as descriptor table 116/118.

The implementation of descriptor table 116/118 is based on the observation that frequent well-known packets forwarded via communication mediums have a well-known structure that usually can be inferred by knowing the packet type. Hence, a highly optimized mechanism can be defined by encoding the most common types of packets in a number or descriptor stored in descriptor table 116/118. The encoding identifies a well-known packet and hence a specific header format and suppression rule. As long as both sides of the transmission (e.g., CMTS 102 and cable modem 104) have well established the suppression rules then there is very little information that needs to be sent via the communication medium, thereby reducing the amount of bandwidth required to transmit packets. This is particularly important in scenarios, such as cable networks, where reducing bandwidth requirements is more critical than reducing processing at either the cable modem or at the CMTS.

Descriptor table 116 transforms a compressed packet header to a full or extended packet header. The full header may go beyond the header check sum field. In this case, the invention may incorporate simple payload header suppression rules. In an embodiment of the invention, there are some restrictions on how this feature can be used. One restriction may be that the packet cannot be fragmented. This feature is primarily used for voice packet transmission but it may be used for any suppression rule that meets the requirements and does not suppress more bytes than the number of bytes allowed in a row in descriptor table 116/118.

Different types of well-known packets include, but are not limited to, requests for bandwidth, bandwidth grants, TCP/IP ACK messages and voice packets. Example formats for each of these packet types are described below with reference to FIGS. 4-11.

Figure 2:
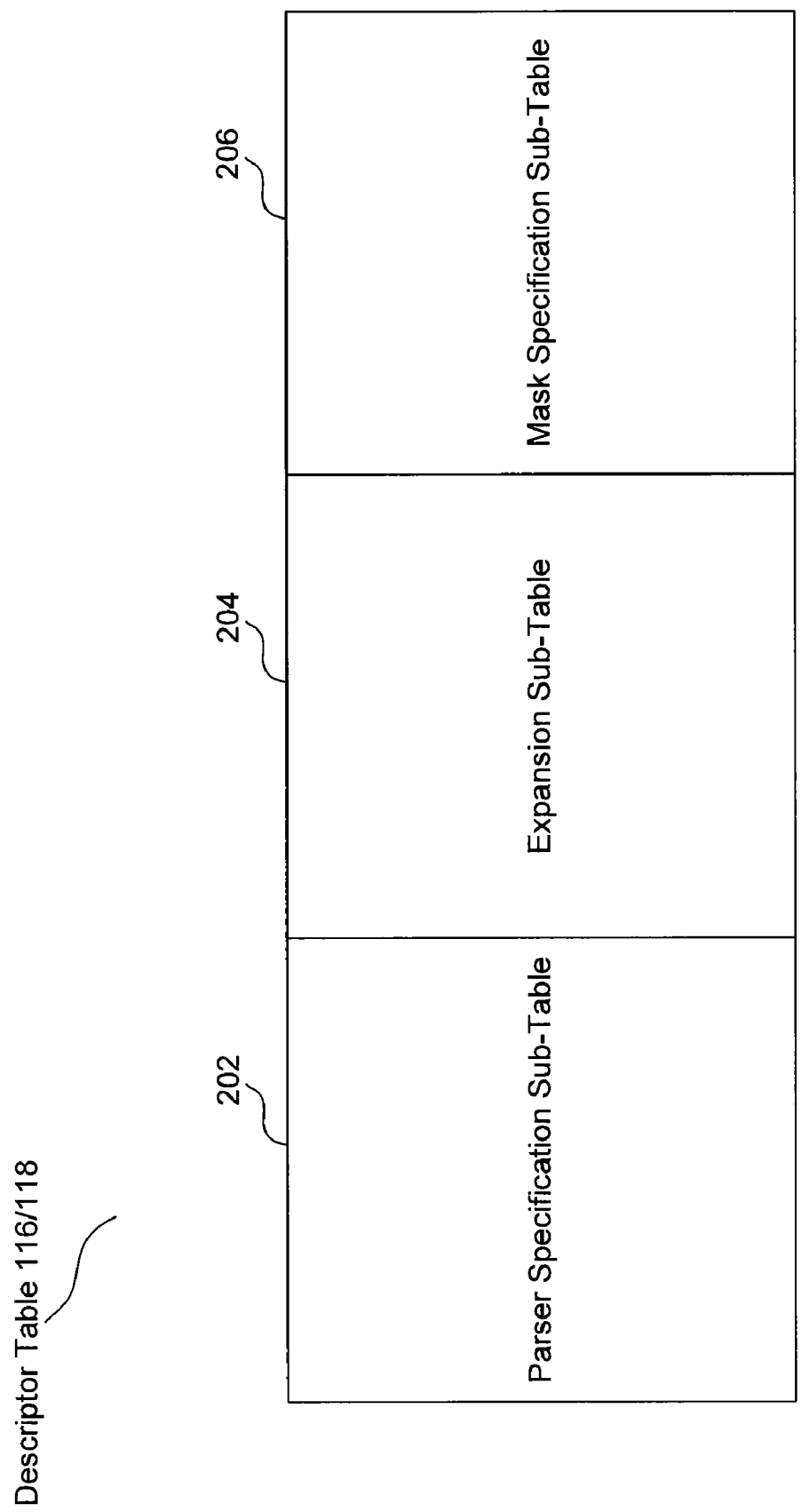
FIG. 2 illustrates a descriptor table according to an embodiment of the invention.

Descriptor table 116/118 is shown in FIG. 2. Descriptor table 116/118 includes a parser specification sub-table 202, an expansion sub-table 204 and a mask specification sub-table 206. In general, parser specification sub-table 202 contains the specification of the suppressed packet header to reconstruct, how to interpret this header, and flags to operate hardware to parse the reconstructed packet appropriately. Expansion sub-table 204 contains the values of the fields that are suppressed so that the full header can be reconstructed from the suppressed header. Finally, mask specification sub-table 206 contains the byte mask to reconstruct the packet.

Descriptor table 116 is indexed with the descriptors. If one byte is reserved for the descriptor then there are a possible range of 256 descriptor values (or a possible 256 entries in descriptor table 116/118). An entry in descriptor table 116 may also be reserved for extension mode bytes which increases the size reserved for the descriptor and therefore increases the possible range of descriptor values. For easy interoperability with DOCSIS, certain parameters used by DOCSIS are not considered valid descriptor values. The present invention therefore maintains a list of descriptor non-valid values. Examples of non-valid values include 0x00, 0xC0, 0xC2 and 0xC4. Each of the sub-tables is described next.

1. Parser Specification Sub-Table

Parser specification sub-table 202 contains the specification of the suppressed packet header to reconstruct, how to interpret this header, and flags to operate hardware to parse the reconstructed packet appropriately. Example fields in parser specification sub-table 202 are shown in Table 1, and is not meant to limit the invention. The version code (or reference template) and packet type fields indicate the template. The remaining fields shown in Table 1 are example packet fields that the invention attempts to suppress. It is important to note that each of these fields may not be applicable for each descriptor entry and the packet fields may change depending on the different template or protocol used.

TABLE 1

| Field | Description |
| --- | --- |
| Version Code | Different versions of a type of packet may use different template headers. This field is used to identify the correct reference template. |
| Packet Type | The packet type field is used to follow different flow paths for particular types of packets. For example, a bandwidth request may be assigned type "0", a voice packet may be assigned type "1", a control packet may be assigned type "2", and so forth. |
| Length of Header | The length of header field is the length in bytes/bits of the full packet header. |
| Packet Length | The packet length field is the length in bytes/bits of the packet length when the packet is known to be of a particular size. |
| Error Check Code | The error check code field represents which error codes should be checked. |
| Baseline Privacy Code | The baseline privacy code field represents the level of privacy code assigned to the packet. |
| Suppression Code | The suppression code field indicates the type of suppression used on the packet, if any. |
| Fragmentation Code | The fragmentation code field indicates whether or not the packet is fragmented, and if so, which fragment is contained in the particular packet. |
| Extended Header Length | The extended header length field indicates a variable length number of bytes that do not need to be interpreted is copied as it is in the reconstructed packet. |

Note that having different reference templates allows a transmission of different packet types. Therefore, the descriptor mechanism of the invention can also be used as an interoperability framework to support different protocols in the same medium, such as DOCSIS and Propane or DOCSIS and MPEG video transport. Expansion sub-table 204 is described next in more detail.

2. Expansion Sub-Table

Expansion sub-table 204 contains the values of the fields that are suppressed so that the full header can be reconstructed from the suppressed header. In general the suppressed fields can be of any type. However, if the field is service class identifier (SCID) based then it will limit the use of this particular descriptor to a given flow. This is feasible as long as there is enough descriptors to support the more general rules.

The invention gives no particular name to the suppressed values because for each descriptor the same byte may correspond with a different header field. Hence, expansion sub-table 204 is simply specified as the number of suppressed bytes followed by the values for the expansion, as shown in Table 2.

TABLE 2

| Field | Description |
| --- | --- |
| Number of Suppressed Bytes (NSB) | Value that indicates the total number of suppressed bytes. |
| Byte 1 | Value of the first byte suppressed. |
| . | |
| . | |
| . | |
| Byte NSB | Value of the last byte suppressed. |

An example suppressed header field is described next. The present invention pairs the cable modem ID (CMID) and service class ID (SCID) to represent a SID value. Thus, the SID value is two bytes. Each byte can be suppressed independently. In this example, the invention defines the least significant byte as the SCID value and most significant byte as the CMID value. Note that a rule with one of the two bytes of the SID value suppressed will be a global rule that applies to a set of SIDs. On the other hand, a rule with both SID bytes suppressed will only apply to an individual flow in the cable network. But it is important to note that since descriptors can be defined, and as long as there are no used descriptors because there are no more general rules, these descriptors can be temporarily assigned to individual rules. Mask specification sub-table 206 will now described in more detail.

3. Mask Specification Sub-Table

Mask specification sub-table 206 contains the byte mask to reconstruct the packet. The length of the mask may be variable and therefore it is specified as the first byte of mask specification sub-table 206. This allows specifying a mask that is larger than the extended header, which in turn includes specific (most likely global) fields of a payload suppression rule. The mask in sub-table 206 specifies if the field is carried in the packet (indicated by "P"), or was suppressed and thus in the sub-table (indicated by "S"). An example entry in descriptor table 116/118 is described next.

4. Example Entry in Descriptor Table

Specific packet formats are described in detail below in Section E and in reference to FIGS. 4-11. For illustration purposes, assume that a request packet is specified in the following format:

Descriptor+Service Class ID+Number of Mini-Slots.

This is a simple packet and therefore only requires the following entries in descriptor table 116/118: in parser specification sub-table 202, the packet length equals zero and the extended header length equals two; in expansion sub-table 204, the number of suppressed bytes equals zero; and in mask specification sub-table 206, the mask length equals zero. The operation of the invention is described next.

D. Operation of the Invention

Figure 3:
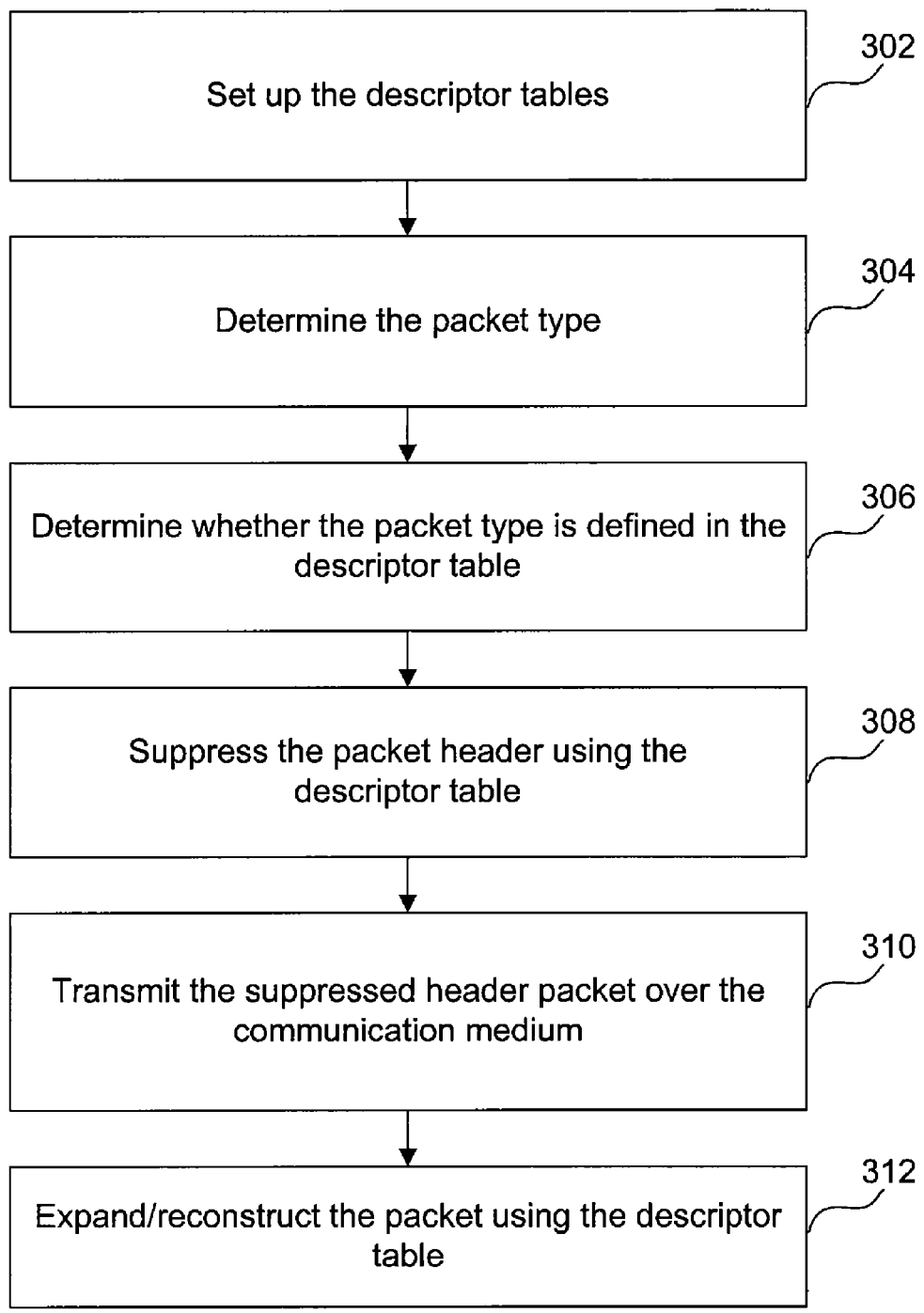
FIG. 3 is a high level flowchart that describes the operation of invention according to an embodiment.

FIG. 3 is a flowchart illustrating the operation of the invention. The flowchart in FIG. 3 starts at step 302. In step 302, descriptor table 116 in cable modem 104 and descriptor table 118 in CMTS 102 are initially set-up when the cable network is configured. As stated above, descriptor tables 116 and 118 are synched together and contain the same information. The main part of tables 116 and 118 is static. The most global descriptors may be specified as part of the cable network configuration. In the invention, only non-used descriptors will be available to be specified on-the-fly. However, it is possible to change the configuration of the descriptors without turning down the cable network. It is important to note that the set-up of tables 116 and 118 is done once and are updated as necessary. Control then passes to step 304.

In step 304, the type of the packet to be transmitted is determined by the transmitter of the packet (e.g., CMTS 102 or cable modem 104). Control then passes to step 306.

In step 306, the transmitter of the packet determines whether the packet type is defined in the descriptor table (e.g., descriptor table 116 if cable modem 104 is the transmitter and descriptor table 118 if CMTS 102 is the transmitter). If the packet type is defined in the descriptor table, then control passes to step 308.

In step 308, the transmitter of the packet uses the descriptor table to suppress the packet header. Control then passes to step 310.

In step 310, the packet with the suppressed header is transmitted via the communication medium. Referring to FIG. 1, if cable modem 104 is the transmitter, then the suppressed header packet is transmitted via upstream communication 108 to CMTS 102. On the other hand, if CMTS 102 is the transmitter, then the suppressed header packet is transmitted via downstream communication 106 to cable modem 104. Control then passes to step 312.

In step 312, the receiver of the suppressed header packet expands or reconstructs it using the descriptor table. The flowchart in FIG. 3 ends at this point. The next section describes example packet formats that may be utilized by the invention. These example packet formats are not meant to limit the invention and are only provided for illustration purposes.

E. Example Packet Formats

As described above, the invention defines rules that optimize the transmissions of the most common packets. A rule can interpret higher layer packets and transmit them with a more compact form. The invention defines two main categories of suppressed header packet formats, including upstream packet formats and downstream packet formats. Upstream packet formats are used for packets transmitted from cable modem 104 to CMTS 102 via upstream communication 108. Downstream packet formats are used for packets transmitted from CMTS 102 to cable modem 104 via downstream communication 106. These example packet formats are defined for a particular protocol header example and are not meant to limit the invention. These two main categories are described next.

1. Upstream Packet Formats

Upstream packet formats are further subdivided into two types, including burst and message packet formats. Message packet formats are described next, followed by burst packet formats.

a) Message Packet Formats

Message packet formats include a general message, a voice message, bandwidth request messages, and a TCP/IP ACK message. All of these message packet formats maybe in a more general form as defined by a default message packet format. The default message is used when there is no other specific rule. Each of these are described next.

The format of a general message 402 is shown in FIG. 4. Referring to FIG. 4, general message 402 includes the following fields: a message descriptor 404, an extended header 406 and a payload (e.g., raw data) 408. Message descriptor 404 is one byte in length and both extended header 406 and payload 408 are variable in length. Message descriptor 404 is defined by the invention as an entry in descriptor table 116/118, as are all other descriptors described in this section.

Message descriptor 404 is used to specify the type of message, and thus specifies the rule on how to interpret extended header 406. General message 402 does not always have payload 408. For very frequent messages, the invention can encode the packet header entirely in message descriptor 404. This is possible for messages, such as control messages, whose payload represents well known information. The voice message format is described next.

The transmission of voice packets over a cable network is important. Hence, a significant amount of packet descriptors could be used in this environment for this type of voice traffic. Other environments could select other preferred traffic. Each voice call is assigned two descriptors. One descriptor is used to transmit voice packets during active periods of the voice call. The other descriptor is used to indicate that the call has gone silent during the voice call. Each voice call has its own descriptor pair. As stated above, the descriptor field is one byte. With a voice packet, the one byte descriptor field is interpreted indirectly as a one bit silent field and a 7 bit voice call identifier field (VCID). The indirection allows the freedom to choose the descriptor values without any restrictions. The descriptor pair is assigned to a voice call with the currently available descriptors in descriptor table 116/118 during the call set up.

The voice message format is described in FIG. 5. Referring to FIG. 5, an active voice packet 502 and a silent voice packet 508 are shown. Active voice packet 502 includes the following fields: an active voice descriptor 504 and a payload 506. As above, active voice descriptor 504 is an entry (and thus defined) in descriptor table 116/118. Payload 506 contains raw voice data. Silent voice packet 508 includes the following fields: a silent voice descriptor 510 and a payload 512. Payload 512 contains noise parameters. Active voice descriptor 504 and silent voice descriptor 510 each have a one byte length. Payloads 506 and 512 are of variable lengths.

Note that although each voice call needs two descriptors, the descriptors may not actually need to be reserved for voice. Therefore, if the voice calls are not active then these descriptors can be used for other types of packets. To simplify implementation, the invention may dedicate a small set of descriptors for voice traffic. If more descriptors are needed, then the descriptors call be assigned dynamically. The bandwidth request message format is described next.

The DOCSIS approach to handling piggyback requests is via variable sized headers and extending the header of another message to incorporate the piggyback request when there is a need to send one. The present invention handles piggyback requests as separate requests. Here, the piggyback request is given highest priority to be transmitted anywhere in the burst between other messages. In particular, the invention reserves three descriptors for sending piggyback requests as separate messages. The different descriptors indicate if the message contains either one, two or three requests. A request is defined with a service class identifier (SCID) and the number of mini-slots requested. The three formats of bandwidth request messages are shown in FIG. 6.

Figure 6:
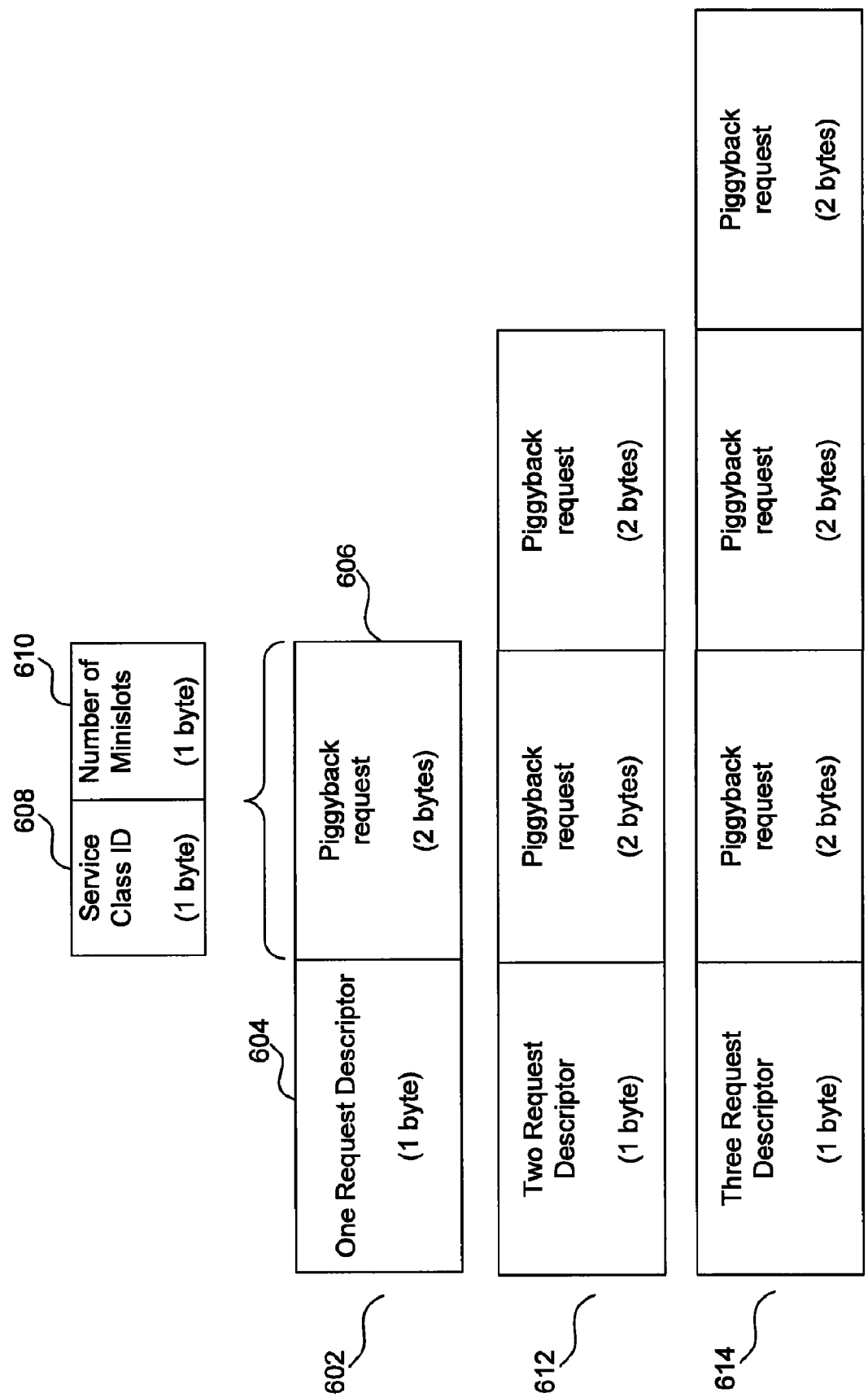
FIG. 6 illustrates the formats of request messages according to an embodiment of the invention.

Referring to FIG. 6, a one request message 602 includes the following fields: a one request descriptor 604 and a piggyback request 606. Piggyback request 606 is two bytes in length. Piggyback request 606 includes the following fields: service class ID (SCID) 608 and number of minislots 610, each one byte in length.

Two request message 612 is similar to one request message 602, except it contains two piggyback requests. The same holds true for three request message 614 which contains three piggyback requests. Note that in the case of DOCSIS a separate packet message can be achieved with a suppression rule of a packet header containing a piggyback message. Therefore, this definition defines a mechanism that supports separate piggyback messages in DOCSIS. The TCP/IP ACK message format is described next.

At least one study has shown that 86% of the packets in web browsing sessions are TCP/IP ACK packets. Therefore, it makes sense to define the TCP/IP ACK type of packet in descriptor table 116/118. A TCP/IP ACK message format is shown in FIG. 7. A TCP/IP ACK message format 702 includes the following fields: a one byte TCP/IP ACK descriptor 704 and a variable length payload 706. The default message format is next described.

Packets in the present invention that do not have a specified rule may use the default message. The default message 802 is illustrated in FIG. 8. Default message 802 describes the template when no suppression is used. It is the reference template. Non-suppressed packets may use the default message descriptor. If more than one template is used, then several default message descriptors (i.e., one for each protocol supported) will be defined. This example is a particular protocol header example and is not meant to limit the invention.

Default message 802 includes the following fields: a default descriptor 804, a service class ID (SCID) 806, a packet pointer 808, flags 810 and a payload 812. Additional optional fields may include a payload header suppression index and a baseline privacy index. Default descriptor 804 and service class id 806 are each one byte in length, packet pointer 808 is 12 bits in length, flags are 4 bits in length, and payload 812 is variable in length Packet pointer 808 represents the length of the whole packet if the packet is not fragmented. Alternatively, if the packet is fragmented then packet pointer 808 contains the first fragment. If the packet contains the middle or last fragment, then packet point 808 represents the size of the payload fragment. Flags 810 contain a first fragment indicator, a last fragment indicator, a baseline privacy indicator and a header suppression indicator.

Another example of a more general default message type is illustrated in FIG. 8 as default message 814. Default message 814 includes the default descriptor (1 byte) 816 and a non-suppressed packet definition (variable length) 818. The other type of upstream packet formats called burst message is described next.

b) Burst Formats

The present invention defines two burst formats, including contention and reserved. This example is a particular protocol header example and is not meant to limit the invention. The contention burst format will be described first, followed by the reserved burst format.

As discussed above, transmissions of packets in contention mini-slots (or bursts) do not need previous reservation by cable modem 104. CMTS 102 does not know which cable modem 104 is transmitting in the contention mini-slot. The entire identifier must be specified in the contention burst format. The service class identifier (SCID) part of the identifier is contained in the message formats. It is then enough to include the cable modem identifier (CMID) as part of the contention burst header.

Figure 9:
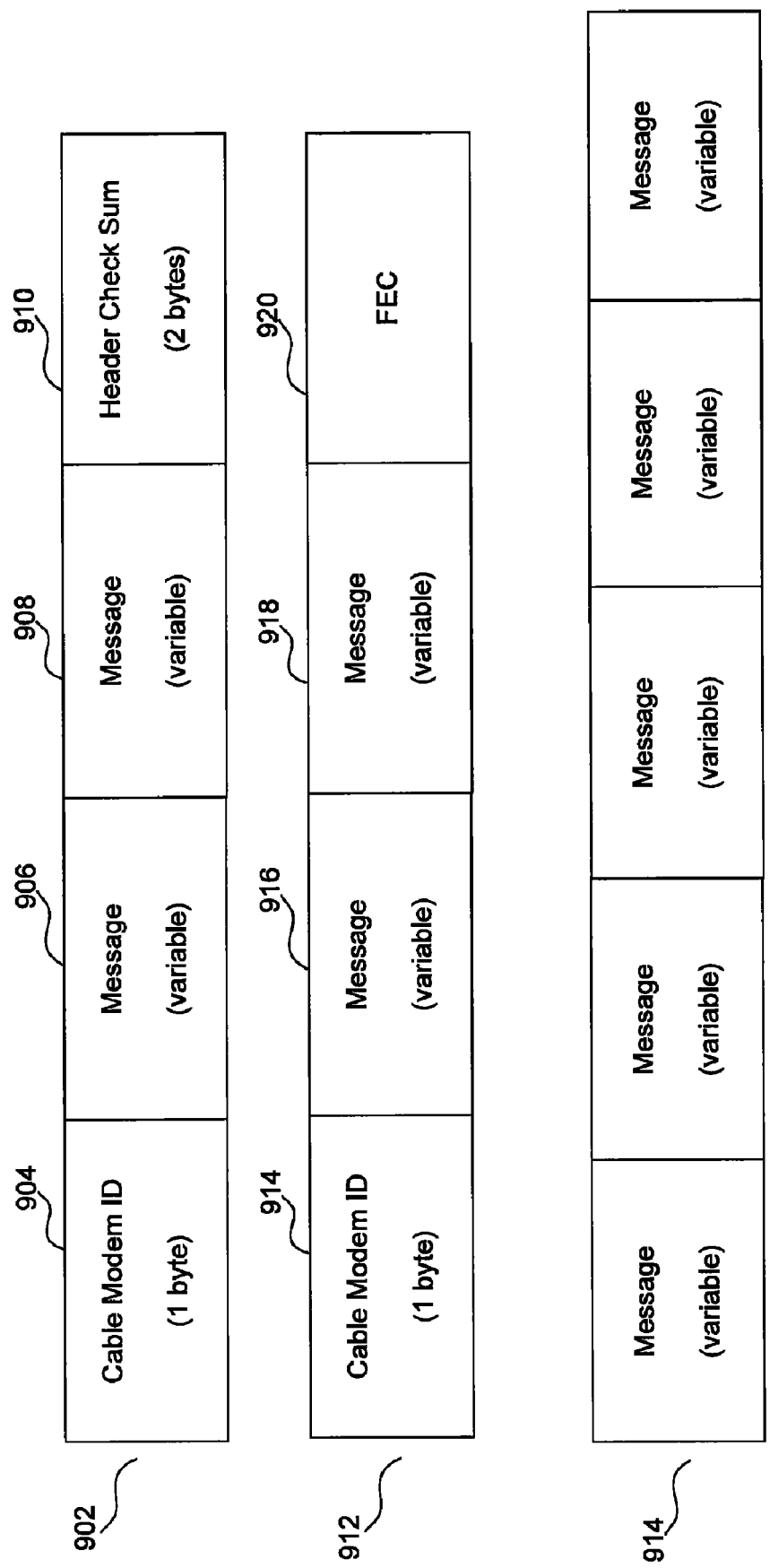
FIG. 9 illustrates the format of a short contention burst, the format of a long contention burst and the format of a reserved burst according to an embodiment of the invention.

The present invention defines two types of contention burst formats, including long and short contention bursts. In FIG. 9, the short contention burst 902 includes the following fields: a cable modem ID 904, a message 906, a message 908 and a header check sum (HCS) 910. Alternatively, the long contention burst 912 includes the following fields: a cable modem ID 914, a message 916, a message 918 and a FEC 920. In general, the invention transmits requests in short contention burst 902 and actual data in long contention burst 912.

Although short data packets may fit in the short contention burst 904 when the mini-slot size increases with the advance physical layer standards. Here, the message field is interpreted as any number of any type of messages interpreted by the contention burst header formats.

Note that with contention burst formats some difficulty may arise when the cable modem ID (CMID) is using more than one byte, that is, when the cable modem ID 904 or 914 is taking some bits of the service class ID (SCID). In order to derive the complete cable modem ID, the burst must contain at least one message with a service class ID. Most of contention bursts will carry a request because this is the actual purpose of going through contention. The request contains the service class ID. The request can only be avoided if all information ready to be sent fits in the contention burst. If it does, this information is sent in a message. Most of the other message formats also contain the service class ID value, except for the ones that are highly compressed. In this case, the service class ID is suppressed because it is inferred from the descriptor. However, one message can be sent with a more complete header format just to be able to derive the cable modem ID, and send the remainder messages in the burst with the more specific rule. Another possibility is to impose a request message of zero size when there is no other message specifying the service class ID. Note that it is expected that these situations will occur too rarely to worth an additional byte of a longer burst header. However, if it is shown to be frequent the burst header will be increased to contain both the cable modem ID and the service class ID. The reserve burst format is described next.

In contrast to a contention mini-slot, a reserved burst is a burst that has been granted to a specific cable modem 104. CMTS 102 can obtain the cable modem ID from the MAP specification. Reserved bursts have a strong FEC protection. Hence, the present invention does not introduce any burst overhead for the reserved burst. In FIG. 9, the present invention defines a reserved burst 914 as a sequence of messages. Described next are downstream packet formats that are used for packets transmitted from CMTS 102 to cable modem 104 via downstream communication 106.

2. Downstream Packet Formats

Two types of messages that use downstream packet formats are immediate feedback messages and resolution algorithm messages. The immediate feedback message is first described, followed by the resolution algorithm message format.

In FIG. 10, immediate feedback message 1001 includes the following fields: a downsteam collision indication descriptor 1002, a channel ID 1004, a resolution algorithm type 1006, a reserved 1008, a number of bursts 1010, a start minislot number 1012, and a burst transmission feedback message 1014 (immediate feedback message 1001 includes 1 to n of burst transmission feedback message 1014). Burst transmission feedback message 1014 includes an offset 1016 and a feedback indication 1018. As shown in FIG. 10, downstream collision indication descriptor 1002 is one byte in length, channel ID 1004 is 4 bits in length, resolution algorithm type 1006 and reserved 1008 are each 2 bits in length, number of bursts 1010 and start mini-slot number 1012 are each one byte in length, and burst transmission feedback message 1014 is 8 bits in length. Of these 8 bits, offset 1016 is 7 bits and feedback indication is 1 bit in length. Start mini-slot number 1012 indicates the number of the first burst specified. The second type of downstream packet formats, resolution algorithm message, is described next.

In FIG. 11, resolution algorithm message 1102 includes the following fields: a resolution algorithm descriptor 1104, a number of parameter sets 1106, a resolution algorithm 1108, and parameters 1110 to parameters 1112. As shown in FIG. 11, resolution algorithm descriptor 1104 is one byte in length, number of parameter sets 1106 is 5 bits in length, resolution algorithm 1108 is 3 bits in length, and parameters 1110 to 1112 are each variable in length.

The invention uses the resolution algorithm type of message to send the resolution algorithm parameters downstream via downstream communication 106 from CMTS 102 to cable modem 104. Different parameters per priority level are necessary. Hence, this message is sent infrequently to specify when the parameters change. Since the parameters can change differently for each priority, not all parameters are sent every time. The number of priority parameters sent is indicated in number of parameter sets 1106. The actual parameters needed for each resolution algorithm is different and is indicated in resolution algorithm 1108. The interpretation of the subsequent parameters is different based on number of parameter sets 1106. This allows the invention to have different cable modems operating with different resolution algorithms. An example environment of the invention is described next.

F. Example Environment of the Present Invention

Figure 12:
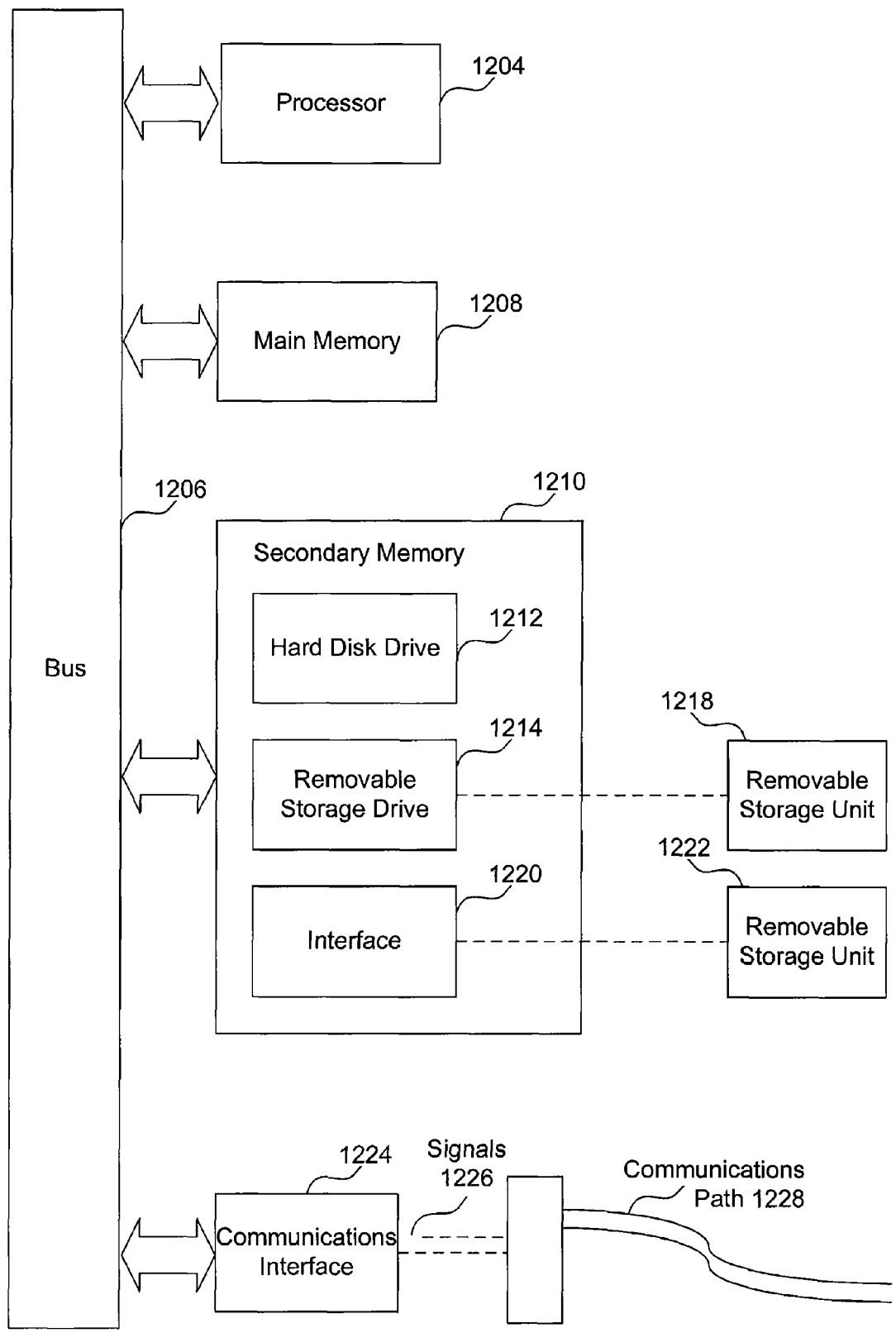
FIG. 12 illustrates an example computer used to implement the CMTS, the CMTS scheduler and the cable modem scheduler according to an embodiment of the invention.

CMTS 102, CMTS scheduler 110 and cable modem scheduler 114 may be implemented using computer 1200 as shown in FIG. 12. Obviously, more than one of these functional components could be implemented on a single computer 1200.

The present invention may be implemented using hardware, software or a combination thereof and may be implemented in a computer system or other processing system. In fact, in one embodiment, the invention is directed toward one or more computer systems capable of carrying out the functionality described herein. The computer system 1200 includes one or more processors, such as processor 1204. The processor 1204 is connected to a communication bus 1206. Various software embodiments are described in terms of this example computer system. After reading this description, it will become apparent to a person skilled in the relevant art how to implement the invention using other computer systems and/or computer architectures.

Computer system 1200 also includes a main memory 1208, preferably random access memory (RAM), and can also include a secondary memory 1210. The secondary memory 1210 can include, for example, a hard disk drive 1212 and/or a removable storage drive 1214, representing a floppy disk drive, a magnetic tape drive, an optical disk drive, etc. The removable storage drive 1214 reads from and/or writes to a removable storage unit 1218 in a well known manner. Removable storage unit 1218, represents a floppy disk, magnetic tape, optical disk, etc. which is read by and written to by removable storage drive 1214. As will be appreciated, the removable storage unit 1218 includes a computer usable storage medium having stored therein computer software and/or data.

In alternative embodiments, secondary memory 1210 may include other similar means for allowing computer programs or other instructions to be loaded into computer system 1200. Such means can include, for example, a removable storage unit 1222 and an interface 1220. Examples of such can include a program cartridge and cartridge interface (such as that found in video game devices), a removable memory chip (such as an EPROM, or PROM) and associated socket, and other removable storage units 1222 and interfaces 1220 which allow software and data to be transferred from the removable storage unit 1218 to computer system 1200.

Computer system 1200 can also include a communications interface 1224. Communications interface 1224 allows software and data to be transferred between computer, system 1200 and external devices. Examples of communications interface 1224 can include a modem, a network interface (such as an Ethernet card), a communications port, a PCM-CIA slot and card, etc. Software and data transferred via communications interface 1224 are in the form of signals which can be electronic, electromagnetic, optical or other signals capable of being received by communications interface 1224. These signals 1226 are provided to communications interface via a channel 1228. This channel 1228 carries signals 1226 and can be implemented using wire or cable, fiber optics, a phone line, a cellular phone link, an RF link and other communications channels.

In this document, the terms "computer program medium" and "computer usable medium" are used to generally refer to media such as removable storage device 1218, a hard disk installed in hard disk drive 1212, and signals 1226. These computer program products are means for providing software to computer system 1200.

Computer programs (also called computer control logic) are stored in main memory 1208 and/or secondary memory 1210. Computer programs can also be received via communications interface 1224. Such computer programs, when executed, enable the computer system 1200 to perform the features of the present invention as discussed herein. In particular, the computer programs, when executed, enable the processor 1204 to perform the features of the present invention. Accordingly, such computer programs represent controllers of the computer system 1200.

In an embodiment where the invention is implemented using software, the software may be stored in a computer program product and loaded into computer system 1200 using removable storage drive 1214, hard drive 1212 or communications interface 1224. The control logic (software), when executed by the processor 1204, causes the processor 1204 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s). In yet another embodiment, the invention is implemented using a combination of both hardware and software.

G. Conclusion

While various embodiments of the present invention have been described above, it should be understood that they have been presented by way of example, and not limitation. It will be apparent to persons skilled in the relevant art that various changes in form and detail may be made therein without departing from the spirit and scope of the invention. This is especially true in light of technology and terms within the relevant art(s) that may be later developed. Thus, the present invention should not be limited by any of the above-described exemplary embodiments, but should be defined only in accordance with the following claims and their equivalents.

What is claimed is:

1. A method of reducing the bandwidth required to transmit a data packet via a wireless network, the method including the steps of:
   generating a packet to be transmitted via the wireless network;
   determining a packet type of the packet to be transmitted via the wireless network; and
   based on the packet type, selectively applying a suppression rule from a table of suppression rules to the packet to generate a suppressed packet, wherein applying a suppression rule includes suppressing at least a portion of the header of the packet and adding a descriptor associated with the header suppression rule to the packet, wherein the table of suppression rules includes:
      a parser specification sub-table, wherein the parser specification sub-table comprises a specification of a suppressed packet header to reconstruct and flags to operate hardware to parse the reconstructed packet;
      an expansion sub-table, wherein the expansion sub-table comprises values of fields that are suppressed so that a full header can be reconstructed from a suppressed header; and
      a mask specification sub-table wherein the mask specification sub-table comprises a byte mask to reconstruct the packet.

2. The method of claim 1, further comprising:
   wirelessly receiving the suppressed packet; and
   based on the descriptor included with the wirelessly-received suppressed packet, selectively applying an expansion rule from a table of expansion rules to the wirelessly-received suppressed packet to generate an expanded packet.

3. The method of claim 1, wherein the packet type is one of a bandwidth request, a bandwidth grant, a Transmission Control Protocol/Internet Protocol acknowledgment message, a voice packet, a default message, a contention burst, and a reserved burst.

4. The method of claim 1, further comprising:
   transmitting the suppressed packet via the wireless network, wherein the step of transmitting the suppressed packet further includes allocating bandwidth for the suppressed packet.

5. The method of claim 1, wherein the step of applying a suppression rule includes suppressing the entire header of the packet.

6. The method of claim 1, wherein the step of applying a suppression rule includes suppressing only a portion of the header of the packet.

7. A method for reducing the bandwidth required to wirelessly receive a packet at a receiving node from a transmitting node via a wireless network, the method comprising:
   receiving a suppressed packet via the wireless network,
   selecting an expansion rule from a table of expansion rules based on a descriptor included with the suppressed packet; and
   applying the expansion rule to the packet to generate a reconstructed packet,
   wherein the table of expansion rules includes:
      a parser specification sub-table, wherein the parser specification sub-table comprises a specification of a suppressed packet header to reconstruct and flags to operate hardware to parse the reconstructed packet;
      an expansion sub-table, wherein the expansion sub-table comprises values of fields that are suppressed so that a full header can be reconstructed from a suppressed header; and a mask specification sub-table, wherein the mask specification sub-table comprising a byte mask to reconstruct the suppressed packet.

8. The method of claim 7, wherein a table of suppression rules associated with the transmitting node and the table of expansion rules are identical.

9. The method of claim 7, wherein a table of suppression rules associated with the transmitting node and the table of expansion rules are set-up when the wireless network is initially configured.

10. The method of claim 7, wherein the transmitting node and the receiving node are further configured to maintain synchronization between the table of suppression rules and the table of expansion rules.

11. The method of claim 7, wherein the reconstructed packet is of a type that is one of: a bandwidth request, a bandwidth grant, a Transmission Control Protocol/Internet Protocol acknowledgment message, a voice packet, a default message, a contention burst, and a reserved burst.

12. The method of claim 7, wherein the receiving node applies the expansion rule to provide the full header of the reconstructed packet.

13. The method of claim 7, wherein the receiving node applies the expansion rule to provide a portion of the full header of the reconstructed packet.

14. The method of claim 7, wherein the parser specification sub-table further comprises a version code field, a packet type field, a header length field, a packet length field, an error check code field, a baseline privacy code field, a suppression code field, a fragmentation code field and an extended header length field.

15. The method of claim 7, wherein the expansion sub-table further comprises a number of suppressed bytes field and values of bytes suppressed.

* * * * *

UNITED STATES PATENT AND TRADEMARK OFFICE
CERTIFICATE OF CORRECTION

| | | |
|---|---|---|
| PATENT NO. | : 7,899,020 B2 | |
| APPLICATION NO. | : 11/808697 | |
| DATED | : March 1, 2011 | |
| INVENTOR(S) | : Sala et al. | |

It is certified that error appears in the above-identified patent and that said Letters Patent is hereby corrected as shown below:

In column 14, line 24, "sub-table wherein" should be replaced with --sub-table, wherein--.

Signed and Sealed this
Third Day of May, 2011

David J. Kappos
*Director of the United States Patent and Trademark Office*